United States Patent
Luo et al.

(10) Patent No.: US 7,485,524 B2
(45) Date of Patent: Feb. 3, 2009

(54) MOSFETS COMPRISING SOURCE/DRAIN REGIONS WITH SLANTED UPPER SURFACES, AND METHOD FOR FABRICATING THE SAME

(75) Inventors: Zhijiong Luo, Carmel, NY (US); Yung F. Chong, Singapore (SG); Judson R. Holt, Wappingers Falls, NY (US); Zhao Lun, Beacon, NY (US); Huilong Zhu, Poughkeepsie, NY (US)

(73) Assignees: International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 402 days.

(21) Appl. No.: 11/425,542

(22) Filed: Jun. 21, 2006

(65) Prior Publication Data

US 2008/0006854 A1    Jan. 10, 2008

(51) Int. Cl.
*H01L 21/8238* (2006.01)
*H01L 21/336* (2006.01)

(52) U.S. Cl. .................. 438/230; 438/300; 438/303; 438/218; 257/E21.64; 257/E21.431

(58) Field of Classification Search ............. 438/142, 438/168, 198, 230, 300, 303; 257/E21.626, 257/E21.64, E21.431
See application file for complete search history.

(56) References Cited

U.S. PATENT DOCUMENTS

| | | | |
|---|---|---|---|
| 5,323,053 A * | 6/1994 | Luryi et al. ................. | 257/485 |
| 5,843,322 A | 12/1998 | Chandler, Jr. | |
| 6,171,966 B1 | 1/2001 | Deacon et al. | |
| 6,921,914 B2 | 7/2005 | Cheng et al. | |
| 6,946,350 B2 | 9/2005 | Lindert et al. | |
| 6,946,371 B2 | 9/2005 | Langdo et al. | |
| 7,405,131 B2 * | 7/2008 | Chong et al. ................. | 438/300 |
| 2004/0121507 A1 | 6/2004 | Bude et al. | |
| 2004/0121564 A1 | 6/2004 | Gogoi | |
| 2005/0009304 A1 | 1/2005 | Zheleva et al. | |
| 2005/0116360 A1 * | 6/2005 | Huang et al. ................. | 257/900 |
| 2006/0038243 A1 * | 2/2006 | Ueno et al. ................. | 257/408 |
| 2007/0026591 A1 * | 2/2007 | Grupp et al. ................. | 438/194 |
| 2008/0001260 A1 * | 1/2008 | Zhu et al. ................. | 257/622 |

* cited by examiner

*Primary Examiner*—Alexander G Ghyka
*Assistant Examiner*—Seahvosh J Nikmanesh
(74) *Attorney, Agent, or Firm*—Scully, Scott, Murphy & Presser, P.C.; Yuanmin Cai

(57) ABSTRACT

The present invention relates to improved metal-oxide-semiconductor field effect transistor (MOSFET) devices comprising source and drain (S/D) regions having slanted upper surfaces with respect to a substrate surface. Such S/D regions may comprise semiconductor structures that are epitaxially grown in surface recesses in a semiconductor substrate. The surface recesses preferable each has a bottom surface that is parallel to the substrate surface, which is oriented along one of a first set of equivalent crystal planes, and one or more sidewall surfaces that are oriented along a second, different set of equivalent crystal planes. The slanted upper surfaces of the S/D regions function to improve the stress profile in the channel region as well as to reduce contact resistance of the MOSFET. Such S/D regions with slanted upper surfaces can be readily formed by crystallographic etching of the semiconductor substrate, followed by epitaxial growth of a semiconductor material.

1 Claim, 5 Drawing Sheets

MOSFETS COMPRISING SOURCE/DRAIN REGIONS WITH SLANTED UPPER SURFACES, AND METHOD FOR FABRICATING THE SAME

FIELD OF THE INVENTION

The present invention relates to semiconductor devices that can be used in complementary metal-oxide-semiconductor (CMOS) circuits. More specifically, the present invention relates to an improved metal-oxide-semiconductor field effect transistor (MOSFET) having source and drain regions with slanted upper surfaces, as well as methods for forming the MOSFET by crystallographic etching and epitaxial growth of semiconductor structures at the source and drain regions.

BACKGROUND OF THE INVENTION

Mechanical stresses within a semiconductor device substrate have been widely used to modulate device performance. For example, in common Si technology, the channel of a transistor is oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in the film direction and/or under compressive stress in the direction normal of the channel. Therefore, compressive and/or tensile stresses can be advantageously created in the channel regions of a p-channel field effect transistor (p-FET) and/or an n-channel field effect transistor (n-FET) in order to enhance the performance of such devices.

One possible approach for creating a desirable stressed silicon channel region is to form embedded SiGe or Si:C stressors at the source and drain regions of a MOSFET to induce compressive or tensile strain therein in the channel region located between the source and drain regions. FIG. 1 shows a conventional MOSFET 102 with embedded SiGe stressors 114 and 116 at its source and drain regions 102S and 102D. Specifically, the source and drain regions 102S and 102D are located in a semiconductor substrate 110, which has an upper surface 110A and contains one or more isolation regions 112 for isolating the MOSFET 102 from adjacent devices. A channel region 102C is also located in the semiconductor substrate 110 and between the source and drain regions 102S and 102D. A gate stack that comprises a gate dielectric layer 122, a gate conductor 124, a gate metal silicide layer 126, and optional sidewall spacers 127 and 128 are formed over the channel region 102C. SiGe stressor structures 114 and 116 are formed in the source and drain regions 102S and 102D for applying compressive stress to the channel region 102C. The SiGe stressor structures have flat upper surfaces 114A and 116A that are parallel to and coplanar with the upper surface 110A of the semiconductor substrate 110.

Another approach for creating a desirable stressed silicon channel region is to form a stress-inducing dielectric capping layer, such as a compressively or tensilely stressed silicon nitride layer, over a MOSFET to induce compressive or tensile stress in the channel region located between the source and drain regions.

Besides stress engineering, different Si surface orientations have also been employed for mobility enhancement. By using {110} Si surface orientation instead of the commonly used {100} Si surface orientation, hole mobility in P-FET shows dramatic improvement.

In addition to the mobility enhancement, contact resistance reduction is also critical for improving MOSFET performance, and it is becoming more and more important with the drastically shrunken geometry and reduced channel resistance. One way to reduce contact resistance is to increase contact area. However, increased contact area is contradictory to the scaling requirements of high-density devices. Therefore, there is a need for innovative methods that can solve this problem.

SUMMARY OF THE INVENTION

The inventors of the present invention have discovered that when recessing the source and drain regions before epitaxially growing SiGe or Si:C or other materials to refill the recessed source/drain regions for a MOSFET on Si substrate or another semiconductor material whose upper surface is oriented at a certain crystal orientation, a properly tailored recess profile can result in refilled source/drain regions whose upper surfaces, or portions of such upper surfaces, are oriented at a different crystal orientation from the crystal orientation of the semiconductor substrate, which may form slanted upper surfaces or partially slanted upper surfaces. When slanted or partially slanted upper surfaces are formed after epitaxy growth and used in conjunction with the overlaying dielectric stressor capping layer, they can enhance the strength of stress and establish better stress profile in the channel region of the MOSFET. Consequently, higher carrier mobility can be achieved in such a MOSFET, in comparison with conventional MOSFETs with source and drain regions of flat upper surfaces. Further, such source and drain regions with slanted upper surfaces can increase the contact area and reduce the overall contact resistance of the MOSFETs.

In one aspect, the present invention relates to a semiconductor device comprising a metal-oxide-semiconductor field effect transistor (MOSFET) having source and drain regions located in a semiconductor substrate. The source and drain regions have upper surfaces that are slanted in relation to an upper surface of the semiconductor substrate.

Preferably, the source and drain regions of the MOSFET of the present invention comprise semiconductor structures that are epitaxially grown in surface recesses of the semiconductor substrate. Such semiconductor structures may have a different lattice constant from the semiconductor substrate. In this manner, compressive or tensile stress may be generated in the channel region of the MOSFET due to lattice mismatch between the epitaxially grown semiconductor structures and the semiconductor substrate. Alternatively, the semiconductor structures may have the same lattice constant as the semiconductor substrate.

More preferably, the upper surface of the semiconductor substrate is oriented along one of a first set of equivalent crystal planes, wherein the surface recesses each has a bottom surface that is parallel to the upper surface of the semiconductor substrate and one or more sidewall surfaces that are oriented along a second, different set of equivalent crystal planes.

When the semiconductor substrate comprises single crystal silicon, the first and second sets of equivalent crystal planes are preferably selected from the group consisting of the {100}, {110}, and {111} planes of silicon.

In a specific embodiment of the present invention, the upper surface of the semiconductor substrate is oriented along one of the {110} planes of silicon, and the one or more sidewall surfaces of the surface recesses are oriented along the {100} planes of silicon. More preferably, the stressor structures at the source and drain regions of the MOSFET may comprise pseudomorphically grown SiGe or Si:C, epitaxially grown silicon or other suitable material.

Further, the semiconductor device of the present invention may comprise a stress-inducing dielectric capping layer located over the slanted upper surfaces of the source and drain regions as well as other parts of the MOSFET. In a particularly preferred, but not necessary, embodiment of the present invention, the stress-inducing dielectric layer comprises tensilely or compressively stressed silicon nitride for N-MOSFET or P-MOSFET, respectively.

In another aspect, the present invention relates to a method for forming a semiconductor device, which comprises:

crystallographically etching a semiconductor substrate at selected source and drain regions of a MOSFET to form surface recesses therein, wherein the semiconductor substrate has an upper surface oriented along one of a first set of equivalent crystal planes, and wherein the surface recesses each has a bottom surface that is parallel to the upper surface of the semiconductor substrate and one or more sidewall surfaces that are oriented along a second, different set of equivalent crystal planes; and growing a semiconductor material in the surfaces recesses at the source and drain regions to form semiconductor structures having upper surfaces that are slanted in relation to an upper surface of the semiconductor substrate.

Further, the method may comprise forming a stress-inducing dielectric capping layer over the slanted upper surfaces of the semiconductor structures at the source and drain regions as well as other parts of the MOSFET.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
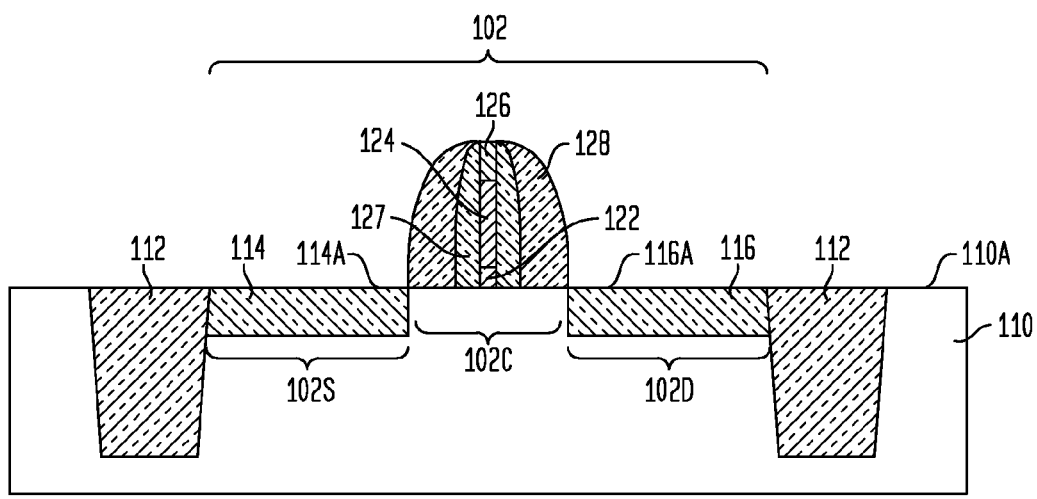
FIG. 1 shows a cross-sectional view of a conventional MOSFET device comprising embedded source and drain SiGe stressors located in source and drain regions with flat upper surfaces.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In single crystal semiconductor materials, all lattice directions and lattice planes in a unit cell of a single crystal material can be described by a mathematical description known as a Miller Index. On one hand, the notation [hkl] in the Miller Index defines a crystal direction or orientation, such as the [001], [100], [010], [110], and [111] directions in a cubic unit cell of single crystal silicon. On the other hand, the crystal planes or facets of a single crystal silicon unit cell are defined by the notation (hkl) in Miller Index, which refers to a particular crystal plane or facet that is perpendicular to the [hkl] direction. For example, the crystal planes (100), (110), and (111) of the single crystal silicon unit cells are respectively perpendicular to the [100], [110], and [111] directions. On the other hand, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [−1−10], [0−1−1], [−10−1], [−110], [0−11], [−101], [1−10], [01−1], and [10−1]; and the <111> directions include the equivalent crystal directions of [111], [−111], [1−11], and [11−1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

Correspondingly, the term "equivalent crystal planes" as used in the present invention refers to a family of equivalent crystal planes or facets as defined by the Miller Indexes, as described hereinabove.

The present invention provides source and drain (S/D) regions with slanted upper surfaces for improving the stress profile and reducing the contact resistance in MOSFET devices. Specifically, the S/D regions of the MOSFET devices of the present invention have upper surfaces that are tilted or slanted with respect to an upper surface of the semiconductor substrate.

Figure 2:
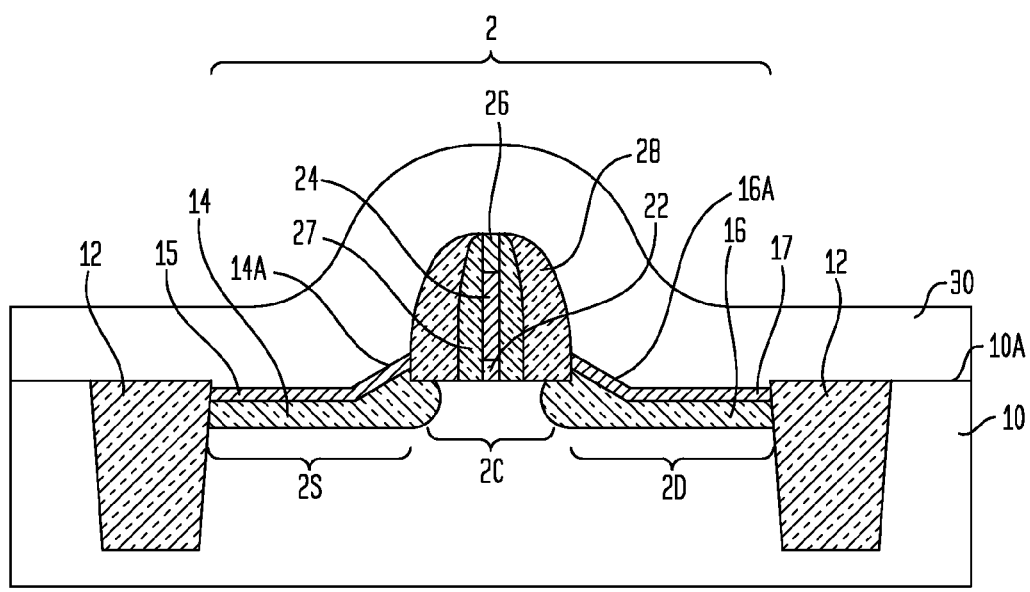
FIG. 2 shows a cross-sectional view of an improved MOSFET device having source and drain regions with slanted upper surfaces, according to one embodiment of the present invention.

FIG. 2 shows a cross-sectional view of an improved MOSFET 2 that comprises S/D regions 2S and 2D with slanted upper surfaces 14A and 16A, according to one embodiment of the present invention.

Specifically, the MOSFET 2 has S/D regions 2S, 2D and a channel region 2C located in a semiconductor substrate 10 and between isolation regions 12. A gate stack that comprises a gate dielectric layer 22, a gate conductor 24, a gate metal silicide layer 26, and optional sidewall spacers 27 and 28 is formed over the channel region 2C.

Semiconductor structures 14 and 16 are located in surface recesses of the semiconductor substrate 10 at the S/D regions 2S and 2D, and they optionally may comprise surface metal silicide layers 15 and 17, respectively, as shown in FIG. 2.

The semiconductor structures 14 and 16 may comprise a semiconductor material that has a different lattice constant from the semiconductor substrate 10, but not limited to semiconductor materials with a different lattice constant. In this manner, the semiconductor structures 14 and 16 are compressively or tensilely stressed due to lattice mismatch between the semiconductor structures 14 and 16 and the semiconductor substrate 10, and such stressed semiconductor structures 14 and 16 can therefore function as stressors for applying corresponding stress to the channel region 2C located therebetween. In a specific embodiment of the present invention, the semiconductor substrate 10 comprises single crystal silicon, and the semiconductor structures 14 and 16 comprise pseudomorphically grown SiGe or Si:C.

Alternatively, the semiconductor structures 14 and 16 may comprise a semiconductor material that has the same lattice constant from the semiconductor substrate 10. In this manner, no stress is created in the channel region 2C by the semiconductor structures 14 and 16, and the only stress-inducing structure is the stressed dielectric capping layer 30 that overlays the MOSFET, which is to be described in greater detail hereinafter. In a specific embodiment of the present invention, the semiconductor substrate 10 comprises single crystal silicon, and the semiconductor structures 14 and 16 comprise epitaxially grown Si.

The S/D semiconductor structures 14 and 16 have portions of their upper surfaces 14A and 16A slanted in relation to an upper surface 10A of the semiconductor substrate 10. In this manner, more stress can be generated in the channel region 2C by the stressed dielectric capping layer 30 through the slanted upper surfaces 14A and 16A of the S/D semiconductor structures 14 and 16, in comparison with conventional S/D regions with flat upper surfaces. Further, MOSFET devices containing such S/D semiconductor structures 14 and 16 with slanted upper surfaces have relatively larger surface area, in comparison with MOSFETs containing the conventional S/D regions with flat upper surfaces, and the MOSFET devices of the present invention therefore have relatively lower contact resistance.

In a particularly preferred, but not necessary, embodiment of the present invention, the semiconductor substrate 10 comprises single crystal silicon, and the substrate surface 10A is oriented along one of the {110} planes of silicon. The semiconductor structures 14 and 16 may comprise either pseudomorphically grown SiGe or epitaxially grown Si.

FIGS. 3-8 illustrate exemplary processing steps that can be used for fabricating the MOSFET device 2 of FIG. 2, according to one embodiment of the present invention.

Figure 3:
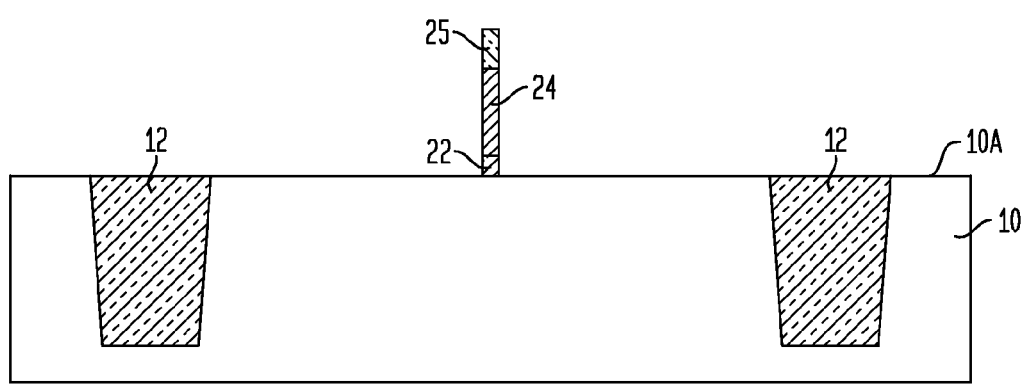
FIGS. 3-8 are cross-sectional views that illustrate exemplary processing steps for forming the improved MOSFET device of FIG. 2, according to one embodiment of the present invention.

First, a gate stack, which comprises a gate dielectric layer 22, a gate conductor layer 24, and a dielectric cap layer 25, is formed over an upper surface 10A of a semiconductor substrate 10, as shown in FIG. 3.

The semiconductor substrate 10 may comprise any suitable single crystal semiconductor material, which includes, but is not limited to: Si, SiC, SiGe, SiGeC, Ge alloys, GaAs, InAs, InP, as well as other III-V or II-VI compound semiconductors. The semiconductor substrate 10 may also comprise a layered semiconductor such as Si/SiGe, a silicon-on-insulator (SOI) or a SiGe-on-insulator (SGOI). Preferably, the semiconductor substrate 10 is composed of a Si-containing semiconductor material, i.e., a semiconductor material that includes silicon. More preferably, the semiconductor substrate 10 consists essentially of bulk single crystal silicon. Alternatively, the semiconductor substrate 10 may comprise one or more buried insulator layers (not shown) therein. The semiconductor substrate 10 may be doped, undoped or contain both doped and undoped regions (not shown) therein.

In a preferred, but not necessary, embodiment of the present invention, the semiconductor substrate 10 comprises single crystal silicon and has an upper surface 10A that is oriented along of the {110} planes of silicon.

At least one isolation region, such as, for example, the trench isolation region 12, can be provided in the semiconductor substrate 10 to isolate the device region for the MOSFET 2 from the adjacent device regions. The isolation region may be a trench isolation region 12 (as shown in FIG. 3) or a field oxide isolation region. The trench isolation region 12 is formed utilizing a conventional trench isolation process well known to those skilled in the art. For example, lithography, etching and filling of the trench with a trench dielectric may be used in forming the trench isolation region 12. Optionally, a liner may be formed in the trench prior to trench fill, a densification step may be performed after the trench fill and a planarization process may follow the trench fill as well. The field oxide may be formed utilizing a so-called local oxidation of silicon process.

The gate dielectric layer 22 of the present invention may be comprised of any suitable dielectric material, including, but not limited to: oxides, nitrides, oxynitrides and/or silicates (including metal silicates and nitrided metal silicates). In one embodiment, it is preferred that the gate dielectric layer 22 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric layer 22 may vary widely, depending on the specific deposition technique employed. Typically, the gate dielectric layer 24 has a thickness from about 0.5 to about 10 nm, with a thickness from about 1 to about 5 nm being more typical. The gate dielectric layer 22 can be formed by a thermal growing process such as, for example, oxidation, nitridation or oxynitridation. Alternatively, the gate dielectric layer 22 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 22 may also be formed utilizing any combination of the above processes.

The gate conductor 24 and the optional dielectric cap layer 25 are formed over the gate dielectric layer 22, by first depositing a blanket gate conductor layer (not shown) and a blanket dielectric capping layer (not shown) over the gate dielectric layer 22, followed by patterning the blanket gate conductor layer (not shown) and the dielectric capping layer (not shown) into the gate conductor 24 and the optional dielectric cap layer 25 using conventional lithography and etching. The lithographic step, preferably inverse gate level (PC) lithography, includes applying a photoresist (not shown) to the upper surface of the blanket dielectric capping layer (not shown), exposing the photoresist (not shown) to a desired pattern of radiation and developing the exposed photoresist (not shown) utilizing a conventional resist developer. The pattern in the photoresist (not shown) is then transferred to the underneath dielectric capping layer (not shown), the blanket gate conductor layer (not shown), and the blanket gate dielectric layer (not shown) utilizing one or more dry etching steps. Suitable dry etching processes that can be used in the present invention include, but are not limited to: reactive ion etching (RIE), ion beam etching, plasma etching or laser ablation. Preferably, but not necessarily, the gate conductor layer 24 comprises polycrystalline silicon (poly-Si), and the dielectric cap layer 25 comprises silicon nitride. The etching step preferably is carried out by RIE techniques. The patterned photoresist (not shown) is then removed by resist stripping after etching has been completed.

Figure 4:
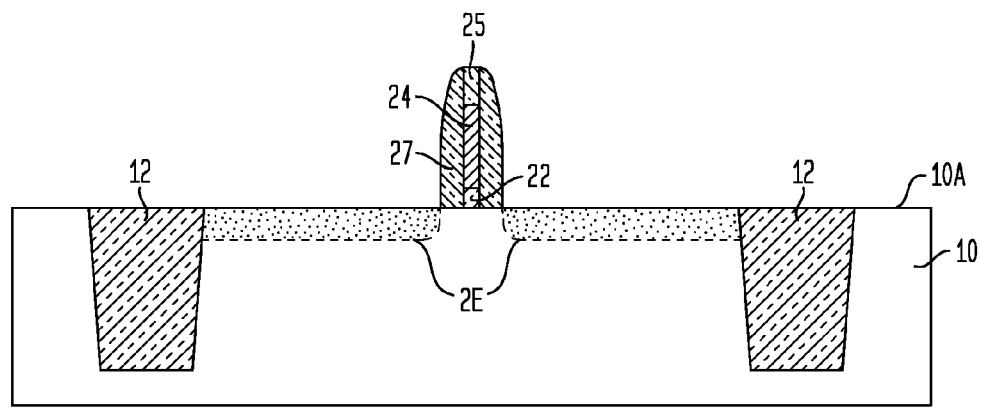

A first dielectric spacer 27 is formed along sidewalls of the gate stack, followed by a first dopant implantation step for forming the S/D extension regions 2E in the semiconductor substrate 10, as shown in FIG. 4. When the MOSFET 2 is a p-channel MOSFET, the S/D extension regions 2E are lightly doped with p-type dopant species, such as boron, aluminum, gallium, and indium. When the MOSFET 2 is an n-channel MOFET, the S/D extension regions 2E are lightly doped with n-type dopant species, such as phosphorus, arsenic, and antimony.

Figure 5:
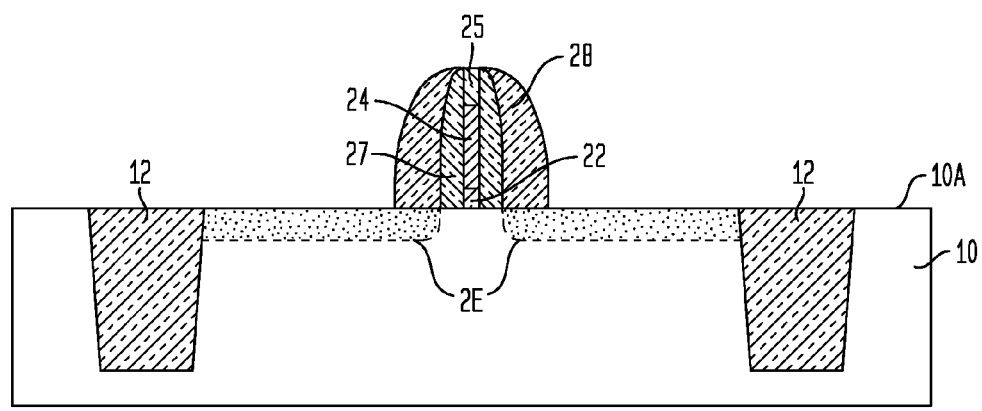

Subsequently, a second dielectric spacer 28 is formed along sidewalls of the gate stack adjacent to the first dielectric spacer 27, as shown in FIG. 5.

Figure 6:
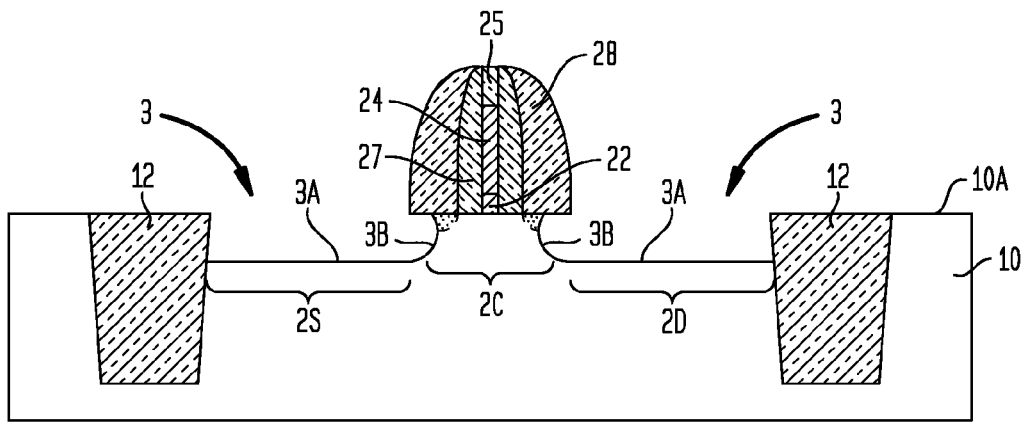

After formation of the second dielectric spacer 28, a crystallographic etching process is carried to form surface recesses 3 in the semiconductor substrate 10 at regions adjacent to the gate stack, as shown in FIG. 6. The surface recesses 3 each has a bottom surface 3A that is parallel to the upper surface 10A of the semiconductor substrate 10 and one or more sidewall surfaces 3B that are slanted or tilted away from the upper surface 10A of the semiconductor substrate 10. Specifically, when the upper surface 10A of the semiconductor substrate 10 is oriented along one of the {110} planes of silicon, the sidewall surfaces 3B of the recesses 3 are oriented along the {100} planes of silicon, which are tilted at 45° angles in relation to the {110} crystal planes.

The crystallographic etching step as mentioned hereinabove can be carried out by any suitable dry and/or wet etching techniques known in the art, including, but not limited to: reactive ion etching (RIE), isopropyl alcohol-based wet etching, etc. The crystallographic etching etches the semiconductor substrate 10 isotropically, but at significantly different rates along different crystal planes or orientations. Therefore, the etch patterned formed by a crystallographic etching process proceeds along the fast-etched crystal planes and is eventually terminated by the slowly etched crystal planes.

Figure 7:
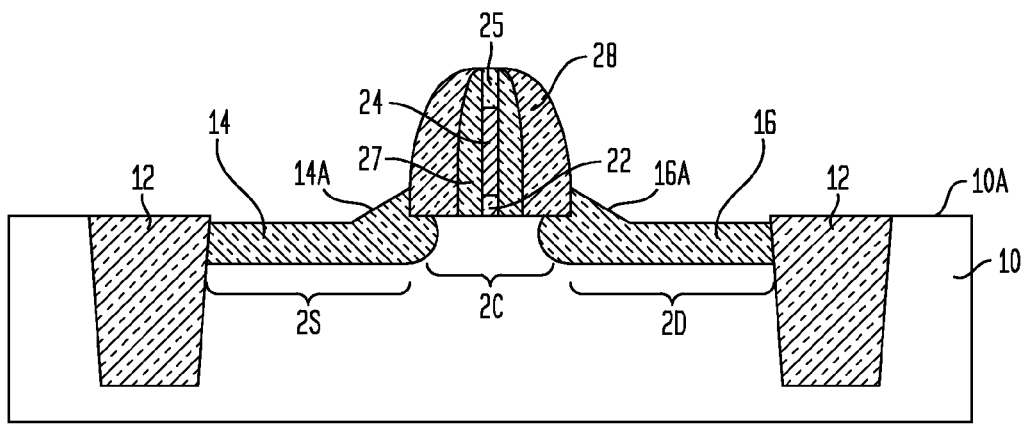

After formation of the surface recesses 3 in the semiconductor substrate 10, an epitaxial growth step can be carried out to grow a semiconductor material in the recesses 3 to form the semiconductor structures 14 and 16, as shown in FIG. 7. As mentioned hereinabove, the semiconductor structures 14 and 16 may comprise a semiconductor material that has a different lattice constant from the semiconductor substrate 10, or a semiconductor material that has the same lattice constant as the semiconductor 10. Specifically, when the semiconductor substrate 10 comprises single crystal silicon, the semiconductor structures 14 and 16 may comprise either pseudomorphically grown SiGe or Si:C or epitaxially grown Si.

When the semiconductor structures 14 and 16 are formed by a semiconductor material having a different lattice constant from the semiconductor substrate 10, tensile or compressive stress is created in the semiconductor structures 14 and 16, due to the lattice mismatch between the semiconductor structures 14 and 16 and the substrate 10. Such stressed semiconductor structures 14 and 16 in turn apply stress to the channel region 2C of the MOSFET 2. For example, when the semiconductor substrate 10 comprises single crystal silicon, SiGe can be used to form compressively stressed semiconductor structures 14 and 16 for creating compressive stress in the channel region 2C of the MOSFET 2. Alternatively, Si:C can be used to form tensilely stressed semiconductor structures 14 and 16 for creating tensile stress in the channel region 2C of the MOSFET 2.

When the semiconductor structures 14 and 16 comprise a semiconductor material having the same lattice constant as the semiconductor substrate 10, no stress is created in the semiconductor structures 14 and 16, due to the perfect lattice mismatch between the semiconductor structures 14 and 16. In this event, stress is applied to the channel region 2C by a subsequently deposited stress-inducing dielectric layer 30, as shown in FIG. 2, instead of by the semiconductor structures 14 and 16.

The growth rate of a semiconductor material can be significantly different along different crystallographic directions. For example, SiGe grows significantly faster over the {100} planes of silicon than over the {110} planes of silicon. Therefore, when the bottom surfaces 3A of the surface recesses 3 are oriented along one of the {110} planes and the sidewall surfaces 3B are oriented along the {100} planes, semiconductor materials (such as SiGe, Si, etc.) that are epitaxially grown in such surface recesses 3 will have upper surfaces that are slanted in relation with the upper surface 10A of the substrate 10, due to overgrowth over the sidewall surfaces 3B and undergrowth over the bottom surfaces 3A. As mentioned hereinabove, the semiconductor structures 14 and 16 with slanted upper surface are particularly effective in improving the stress profile in the channel region 2C and reducing the contact resistance of the MOSFET 2.

Doping of the source and drain regions 2S and 2D can be carried out either in situ, i.e., during the epitaxial growth of the semiconductor structures 14 and 16, or by implantation after the growth of the structures 14 and 16.

Figure 8:
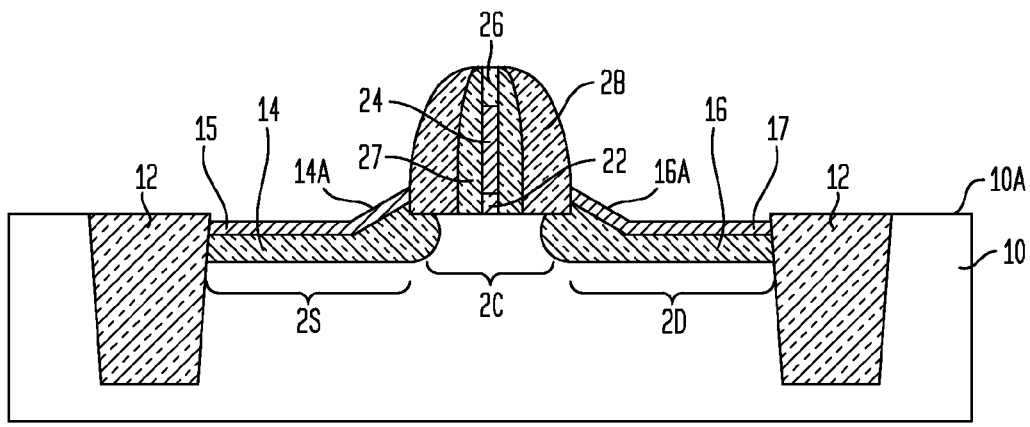

After formation of the semiconductor structures 14 and 16, the dielectric cap layer 25 can be removed from over the gate conductor 24, and optional metal silicide contact layers 15, 17, and 26 can then be formed over the source region 2S, the drain region 2D, and the gate conductor 24, as shown in FIG. 8.

Subsequently, a stress-inducing dielectric capping layer 30 is deposited over the entire structure, including the slanted upper surfaces 14A and 16A of the semiconductor structures 14 and 16, to form a complete MOSFET 2 as shown in FIG. 2. The stress-inducing dielectric layer 30 preferably comprises tensilely or compressively stressed silicon nitride, which can be readily formed by any suitable dielectric deposition method. Specifically, a compressively or tensilely stressed silicon nitride layer can be formed by, for example, a low pressure chemical vapor deposition (LPCVD) process, a plasma enhanced chemical vapor deposition (PECVD) process, or a high density plasma (HDP) deposition process. Preferably, the compressively or tensilely stressed silicon nitride layer 30 has a thickness ranging from about 10 nm to about 500 nm, more preferably from about 20 nm to about 200 nm, and most preferably from about 40 nm to about 100 nm.

Additional CMOS processing steps that are well known in the art, such as, for example, interlevel dielectric deposition and metal contact formation steps, can be readily carried out to complete the MOSFET device 2. Such conventional CMOS processing steps are not described in detail herein, in order to avoid obscuring the present invention.

Figure 9:
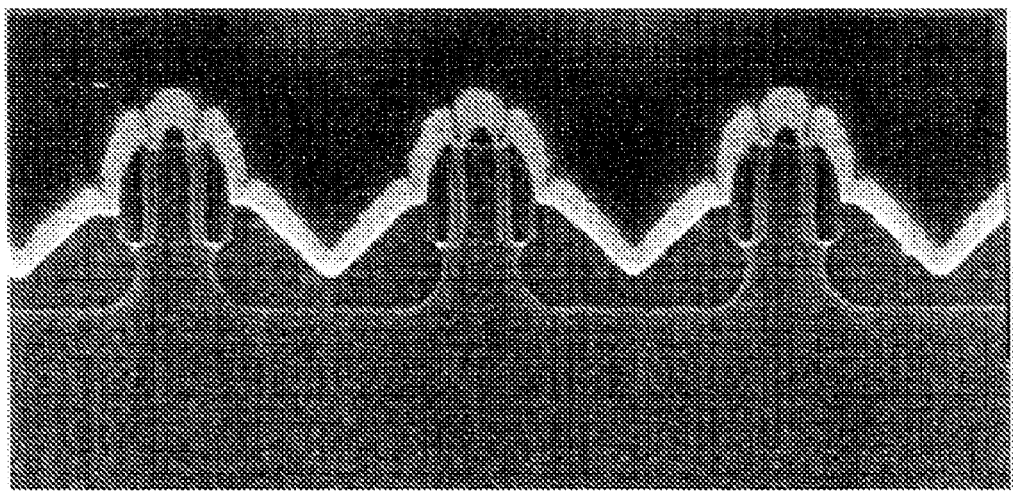
FIG. 9 is a scanning electron microscope (SEM) photograph of MOSFETs that comprise embedded source and drains stressor structures with slanted upper surfaces.

FIG. 9 shows a scanning electron microscopic (SEM) photograph of MOSFETs that comprise source and drains regions with slanted upper surfaces, as described hereinabove.

Note that while FIGS. 2-9 illustratively demonstrate an exemplary MOSFET device structure and exemplary processing steps for forming such a device structure, according to specific embodiments of the present invention, it is clear that a person ordinarily skilled in the art can readily modify such a device structure and processing steps for adaptation to specific application requirements, consistent with the above descriptions. For example, while the semiconductor substrates shown in FIGS. 2-7 represent bulk semiconductor substrates, it should be appreciated that semiconductor-on-insulator (SOI) substrates can also be used for practice of the present application. Further, while the {110} and {100} crystal planes of single crystal silicon are primarily illustrated by FIGS. 2-7, other suitable crystal planes, such as the {111}, {211}, {311}, {511}, and {711} planes of single crystal silicon, can also be used in any suitable combination in the present invention, consistent with the spirit and principles described hereinabove.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:

crystallographically etching a semiconductor substrate at selected source and drain regions of a MOSFET to form surface recesses therein, wherein the semiconductor substrate has an upper surface oriented along one of a first set of equivalent crystal planes, and wherein each surface recess has a bottom surface that is parallel to the upper surface of the semiconductor substrate and one or more sidewall surfaces that are oriented along a second, different set of equivalent crystal planes, wherein the upper surface of the semiconductor substrate is oriented along one of the {110} planes of silicon, and wherein the one or more sidewall surfaces of the surface recesses are oriented along the {100} planes of silicon;

growing a semiconductor material having a different lattice constant from the semiconductor substrate in said surface recesses at the source and drain regions to form semiconductor structures having upper surfaces or portions of upper surfaces that are slanted in relation to an upper surface of the semiconductor substrate, said semiconductor material comprising pseudomorphic SiGe or Si:C; and forming a stress-inducing dielectric layer over the slanted upper surfaces of the semiconductor structures at the source and drain regions.

* * * * *